(12) United States Patent
Li et al.

(10) Patent No.: US 7,368,960 B2
(45) Date of Patent: *May 6, 2008

(54) CIRCUIT AND METHOD FOR MONITORING THE INTEGRITY OF A POWER SUPPLY

(75) Inventors: Gabriel M. Li, San Francisco, CA (US); Greg J. Richmond, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 242 days.

This patent is subject to a terminal disclaimer.

(21) Appl. No.: 11/153,759

(22) Filed: Jun. 15, 2005

(65) Prior Publication Data

US 2006/0284655 A1 Dec. 21, 2006

(51) Int. Cl.
*H03L 7/00* (2006.01)
(52) U.S. Cl. ...................................... 327/143
(58) Field of Classification Search ......... 327/142–143
See application file for complete search history.

(56) References Cited

U.S. PATENT DOCUMENTS

| | | | |
|---|---|---|---|
| 5,019,996 A | 5/1991 | Lee | |
| 5,539,910 A | 7/1996 | Brueckmann et al. | |
| 5,920,726 A | 7/1999 | Anderson | |
| 5,982,141 A * | 11/1999 | Hinohara | 320/113 |
| 6,346,834 B1 | 2/2002 | Chai | |
| 6,351,212 B1 * | 2/2002 | Lynch | 340/506 |
| 6,472,912 B1 | 10/2002 | Chiu et al. | |
| 6,542,427 B2 * | 4/2003 | Roohparvar | 365/226 |
| 6,630,844 B1 | 10/2003 | Chong et al. | |
| 6,683,481 B1 | 1/2004 | Zhou et al. | |
| 2002/0104031 A1 | 8/2002 | Tomlinson et al. | |
| 2002/0149387 A1 | 10/2002 | De Jong et al. | |
| 2005/0040863 A1 | 2/2005 | Shumarayev et al. | |

FOREIGN PATENT DOCUMENTS

| | | |
|---|---|---|
| GB | 2328094 | 2/1999 |
| WO | 97/11428 | 3/1997 |

OTHER PUBLICATIONS

International Search Report, PCT/US2006/021369, mailed Nov. 7, 2006.
International Search Report, PCT/US2006/021426, mailed Mar. 30, 2007.

* cited by examiner

*Primary Examiner*—Dinh T. Le
(74) *Attorney, Agent, or Firm*—Kevin L. Daffer; Daffer McDaniel, LLP

(57) ABSTRACT

Circuits and methods are provided herein for monitoring the integrity of a power supply, the circuits and methods providing additional resources/information for diagnosing a cause behind a reset signal, and in some cases, a reason behind a power failure. A first method described herein provides exemplary steps for monitoring a level of a power supply voltage supplied to one or more system components. A second method describes exemplary steps for monitoring an electrical connection between the power supply (or ground supply) and one or more supply pins. Each of the methods involves monitoring a state of one or more bits stored, e.g., within a status register. The methods may be used separately, or in conjunction with one another, for detecting the occurrence of a power abnormality.

25 Claims, 6 Drawing Sheets

CIRCUIT AND METHOD FOR MONITORING THE INTEGRITY OF A POWER SUPPLY

BACKGROUND OF THE INVENTION

1. Field of the Invention

This invention relates to power supply monitoring schemes and, more particularly, to a circuit and method for monitoring the integrity of a power supply by monitoring a level of the power supply and/or an electrical connection between the power supply and a power supply pin.

2. Description of the Related Art

The following descriptions and examples are given as background only.

Many integrated circuits and systems, such as microprocessors, microcontrollers and other programmable logic devices, are sensitive to the output levels of the power supplies driving the systems. In fact, such systems are often characterized by unique requirements for initialization control sequences, power-up and power-down control sequences, and unintentional reset sequences that may occur, e.g., during power glitches.

For instance, many programmable logic devices (PLDs) must be "powered-up" or awakened from a zero power state to a point at which the power supply voltage reaches an acceptable operating voltage level. For example, internal memory cells, registers and configuration state machines of the device may all be initialized according to specific power-up reset sequences. Once the power supply voltage reaches an acceptable operating voltage level, the configuration state machine may take control of the configuration process by loading configuration data into volatile memory cells. When all of the data has been loaded, the I/O pins of the PLD are enabled and the device is ready to begin performing its programmed function.

Another reset process takes place when a device is powered down, i.e., when the power supply voltage is brought down from the operating voltage level to the zero power state (or below a triggering voltage level). During the power-down reset sequence, the PLD may detect that the power supply voltage has reached or is nearing an unacceptably low level. If detected, the PLD performs a sequence of operations such as saving current memory cell, register and state machine information, informing other integrated circuits to stop sending data to the PLD, and so forth.

The power-up and power-down reset procedures are complicated by the fact that power supplies can be noisy, sometimes glitching significantly above and/or below a triggering voltage level. For example, assume that the PLD (or another power-dependent component) is included within a computer system that shares a power supply line with various appliances (such as an air conditioner, electric drill, etc.). In some cases, a large current spike may be introduced into the shared supply line when one or more of the appliances are turned on. If the current spike causes the supply line voltage to drop below the acceptable operating voltage level, the PLD may lose volatile information (such as register and memory content) or may enter the wrong configuration state. In addition to glitches, other types of power failure (such as temporary loss of power) may produce the same results by not giving the PLD enough time to perform a proper power-down sequence.

During the power-up reset sequence, a reset signal is typically asserted (i.e., "ON") when the power supply voltage is rising towards the acceptable operating voltage level, and deasserted (i.e., "OFF") once the power supply voltages reaches the acceptable level. The power-down reset sequence is similar; however, the reset signal is asserted once the power supply voltage falls below an unacceptable operating voltage level, and deasserted once the power supply voltage reaches the zero power state. To operate properly, both reset sequences must be asserted for a specific duration of time needed to perform the power-up or power-down sequence of operations.

Most conventional systems include at least one power-on reset (POR) circuit for monitoring the power supply voltage and generating a reset signal, in accordance with a power-up and/or power-down reset operation. The POR circuit may also be implemented to ensure that the reset signals are asserted for the required duration. Most POR circuits are based on circuits comprising resistors and capacitors (e.g., RC POR circuits) or, in some cases, voltage comparators comprising voltage dividers and voltage reference generators (e.g., bandgap POR circuits). All provide an active high (or active low) reset signal to one or more system components, indicating that they should perform the necessary power-up or power-down reset functions. However, none of the conventional POR circuits provide indication as to the cause behind the reset signal, thus, leaving the circuit designer or user in the dark as to the reason for the power failure.

For at least these reasons, a need remains for an improved circuit and method for monitoring the integrity of a power supply, where such method provides the circuit designer/user with additional resources/information for diagnosing a cause behind the reset signal, and thus, a reason for the power failure.

SUMMARY OF THE INVENTION

The problems outlined above may be in large part addressed by an improved circuit and method for monitoring the integrity of a power supply by monitoring the state of one or more bits stored within a status register. If the state of the one or more bits changes, e.g., from a "set state" to a "cleared state," a circuit designer or user of the system may conclude that a power abnormality has occurred, rather than a normal power-up or power-down operation.

According to one embodiment, a method is provided herein for monitoring the integrity of a power supply, such method comprising: setting a first bit in a status register if a level of the power supply reaches a threshold level; setting a second bit in the status register if a power supply pin is in electrical contact with the power supply; and monitoring the integrity of the power supply by detecting a change in state of at least one of the first and second bits. In some cases, the method may only monitor the state of the first bit, or the state of the second bit, in the status register. In other cases, the first and second bits may each be monitored for changes.

When monitoring the first bit, the method may perform one or more steps prior to the step of setting the first bit. For example, the method may include: clearing the first bit in response to a power-on/reset of a system; and monitoring an output signal supplied from a power-on/reset (POR) circuit associated with the system. In this manner, the step of setting the first bit may be performed only if the output signal supplied from the POR circuit comprises an asserted power-on/reset signal followed by a deasserted power-on/reset signal. In other words, the first bit may be initially cleared during system power-up (e.g., upon detecting an asserted power-on/reset signal). Once the power supply reaches an acceptable operating voltage level, the power-on/reset signal may be deasserted and the first bit may be set sometime thereafter. After the first bit is initially set, the state of the first bit may be changed (i.e., from a "set state" to a "cleared state") if a subsequent output signal supplied from the POR circuit comprises an asserted power-on/reset signal. If the state of the first bit changes from a "set state" to a "cleared state," the circuit designer or user of the system may conclude that a power abnormality has occurred, and that the abnormality is caused by the level of the power supply dropping below the threshold level.

When monitoring the second bit, the method may perform one or more steps prior to the step of setting the second bit. For example, the method may include: clearing the second bit in response to a power-on/reset of a system; and monitoring an input signal supplied to a supply pin sensor circuit associated with the system. In this manner, the step of setting the second bit may be performed only if: the input signal comprises an asserted sense enable signal; and an output signal from the supply pin sensor circuit indicates that the power supply pin is in electrical contact with the power supply. In some cases, the sense enable signal may be asserted during system power-up, or by a user at any time (e.g., at various intervals, or in response to an error signal associated with the system). Before or after the second bit is initially set, the second bit may be cleared if the output signal from the supply pin sensor circuit indicates that the power supply pin is not in electrical contact with the power supply. If the second bit fails to be initially set, or changes from a "set state" to a "cleared state," the circuit designer or user of the system may conclude that a power abnormality has occurred, due to loss of an electrical connection between the power supply pin and the power supply.

According to another embodiment, a circuit is provided herein for monitoring the integrity of an electrical connection between a first supply potential and a first supply pin. In general, the circuit may include a transistor having a first terminal coupled to the first supply pin, a second terminal coupled to a second supply potential, and a third terminal coupled for receiving an input signal. The circuit may also include a status register coupled for receiving a pin enabled signal from the second terminal of the transistor. However, the pin enabled signal may only be received if: the input signal comprises an asserted sense enable signal, and an electrical connection exists between the first supply potential and the first supply pin. If the electrical connection is broken, the status register may receive a pin disabled signal from the second terminal of the transistor.

In general, the pin enabled signal may be used for setting a pin enabled bit in the status register, whereas the pin disabled signal may be used for clearing the pin enabled bit in the status register. In this manner, the integrity of the electrical connection between the first supply potential and the first supply pin can be monitored by reading a current state of the pin enabled bit in the status register.

BRIEF DESCRIPTION OF THE DRAWINGS

Other objects and advantages of the invention will become apparent upon reading the following detailed description and upon reference to the accompanying drawings in which.

Figure 1A:
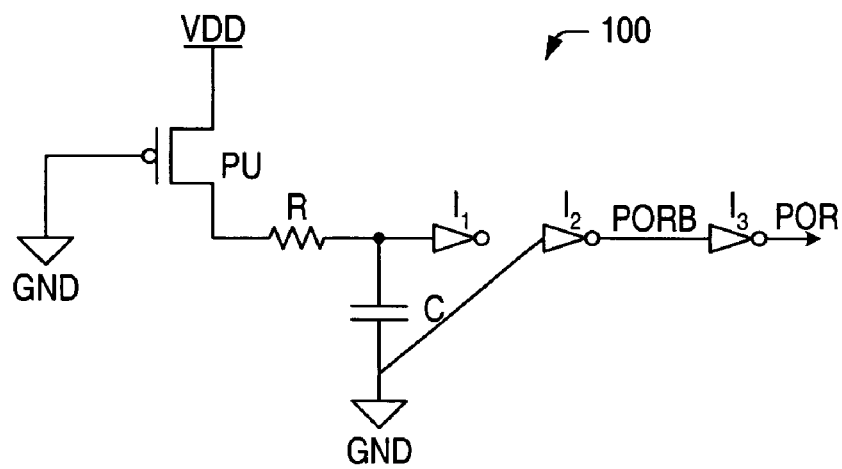
FIG. 1A is a circuit diagram of an exemplary RC power-on/reset (POR) circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1A illustrates one embodiment of a power-on reset (POR) circuit 100 that uses an RC structure to provide a reset signal to one or more system components based on a level of the power supply voltage (VDD). Essentially, as the power supply voltage ramps up to a predetermined level, the value of the reset signal (POR) on the output terminal of POR circuit 100 also rises, due to the increasing charge across capacitor C. When the charge across the capacitor is high enough, the stored charge drives the reset signal low (i.e., inactive) again.

The RC POR circuit of FIG. 1A includes a pull-up transistor (PU), a resistor (R), a capacitor (C), and inverters ($I_1$, $I_2$, $I_3$). The number of inverters on the output path varies according to whether an active low or active high reset signal is desired. In some cases, an active low reset signal (PORB) may be supplied to one or more system components for performing a power-up or power-down reset sequence. In other cases, the PORB signal may be inverted (e.g., by inverter $I_3$) to provide an active high reset signal (POR).

Figure 1B:
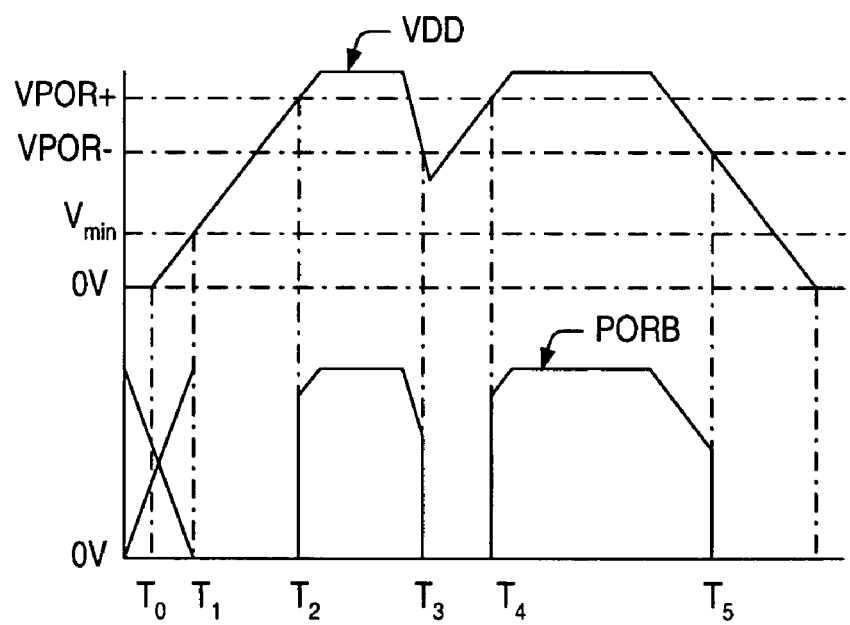
FIG. 1B is a graph of an exemplary output waveform generated by the POR circuit of FIG. 1A.

FIG. 1B illustrates one manner in which the POR circuit of FIG. 1A may generate an active low reset signal (PORB) based on a level of the power supply voltage (VDD). As shown in FIG. 1B, the power supply voltage (VDD) begins to rise at time, $T_0$. At time $T_1$, the power supply voltage rises past the trigger point (i.e., the minimum voltage threshold, $V_{min}$), causing POR circuit 100 to generate an active low (PORB) reset signal. The PORB reset signal goes high (inactive) once VDD reaches an acceptable operating voltage level (VPOR+) at time $T_2$. In order for the one or more system components to reset properly, the duration between times $T_1$ and $T_2$ needs to be at least as long as the power-up sequence.

As shown in FIG. 1B, the PORB reset signal may go low (active) again, e.g., when VDD falls below an unacceptable operating voltage level (VPOR−) at time $T_3$. However, the PORB reset signal becomes active soon thereafter (at time $T_4$) when VDD rises back up to the acceptable voltage level. In some cases, the sharp decrease in VDD may be attributed to a "glitch" in the power supply. As such, the time duration between times $T_3$ and $T_4$ may not be long enough for the system components to perform a proper reset sequence. Note that in the example of FIG. 1B, the rising POR voltage (VPOR+) is different from the falling POR voltage (VPOR−). This difference is typically and due to the difference between the charging and discharging times of capacitor C.

Figure 2A:
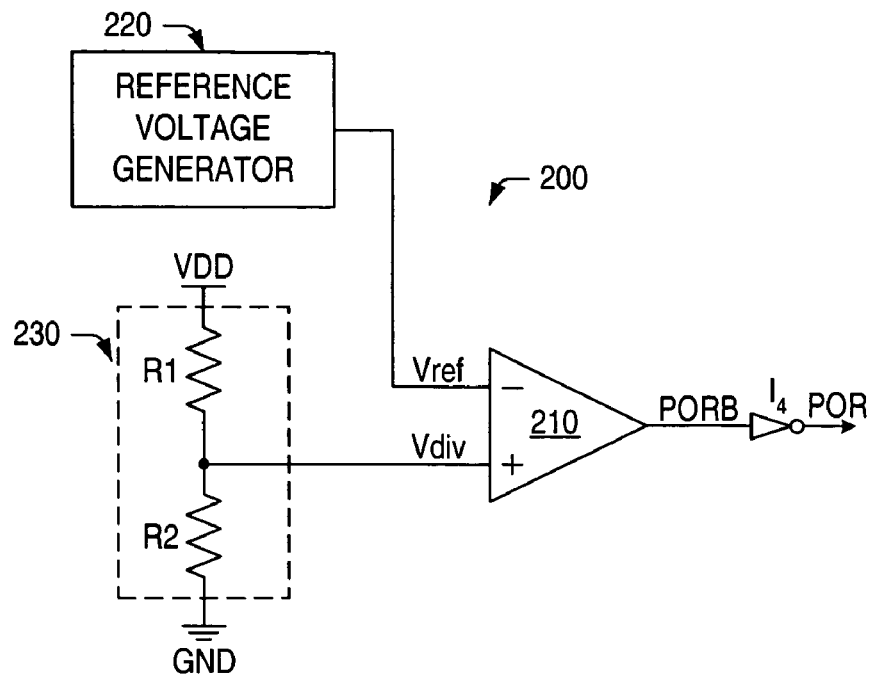
FIG. 2A is a schematic diagram of an exemplary bandgap power-on/reset (POR) circuit.

FIG. 2A illustrates an alternative embodiment of a power-on reset (POR) circuit 200 that generates a reset signal by comparing the power supply voltage (VDD) to a reference voltage (Vref). More specifically, POR circuit 200 may include a comparator for comparing the power supply voltage (divided down using a resistor divider network) to a reference voltage (also derived from VDD). As VDD ramps up to a predetermined level, the value of the reset signal (POR) on the output terminal of POR circuit 200 also rises. When the divided voltage (Vdiv) rises above the reference voltage (Vref), the comparator drives the reset signal low (i.e., inactive) again.

The POR circuit of FIG. 2A includes an analog comparator 210 having a positive input terminal and a negative input terminal. A reference voltage generator 220 supplies the reference voltage (Vref) to the negative terminal of the comparator. In some cases, reference voltage generator 220 may be implemented with a bandgap reference circuit, in which case, POR circuit 200 may be referred to as a "bandgap POR circuit." Voltage divider 230 may include resistors R1 and R2 for dividing down the power supply voltage (VDD) to a predetermined fraction (Vdiv), which is supplied to the positive terminal of the comparator. As known in the art, the voltage provided by voltage divider 230 would be [R2/(R1+R2)]*VDD. In this manner, comparator 210 provides an active low (PORB) reset signal once VDD begins to rise; the PORB signal is deasserted (inactive) once the divided voltage (Vdiv) surpasses the reference voltage (Vref). In some cases, inverter $I_4$ may be included to provide an active high (POR) reset signal.

Figure 2B:
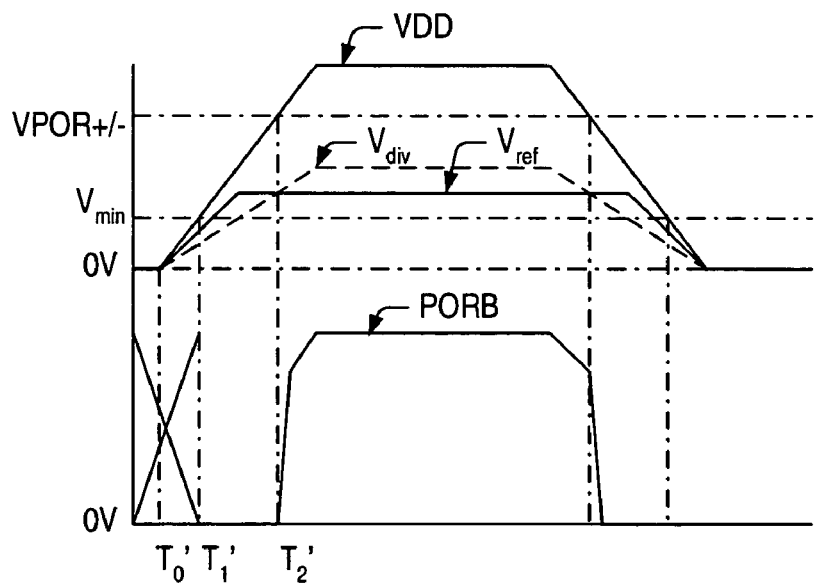
FIG. 2B is a graph illustrating an exemplary output waveform generated by the POR circuit of FIG. 2A.

FIG. 2B illustrates one manner in which the POR circuit of FIG. 2A may generate an active low reset signal (PORB) based on a level of the power supply voltage (VDD). The power supply voltage (VDD) begins to rise at time, $T_0$'. At time $T_1$', the power supply voltage rises past the trigger point (i.e., the minimum voltage threshold, $V_{min}$), causing POR circuit 200 to generate an active low (PORB) reset signal. The PORB reset signal goes high (inactive) once the divided voltage (Vdiv) surpasses the reference voltage (Vref) at time $T_2$'. In order for the one or more system components to reset properly, the duration between times $T_1$' and $T_2$' needs to be at least as long as the power-up sequence. Note that in the example of FIG. 2B, the rising POR voltage (VPOR+) is the same as the falling POR voltage (VPOR−). This is because the POR voltage, rising or falling, depends on a digital output signal from comparator 210, not on the charging and discharging of a (sometimes large) capacitor.

Though POR circuits 100 and 200 are capable of generating a reset signal to initiate a power related event (such as a power-up or power-down reset operation), circuits 100 and 200 are not capable of determining a cause (e.g., power-up, power-down, a glitch or temporary loss of power) for such initiation. The reset signals are simply supplied to one or more system components, indicating that the necessary power-up or power-down functions should be performed. The POR circuits of FIGS. 1 and 2 provide no resources or additional information that would enable a circuit designer or user of the system to diagnose an underlying power-related problem. In other words, conventional POR circuits provide no means for monitoring the integrity of a power supply.

Figure 3:
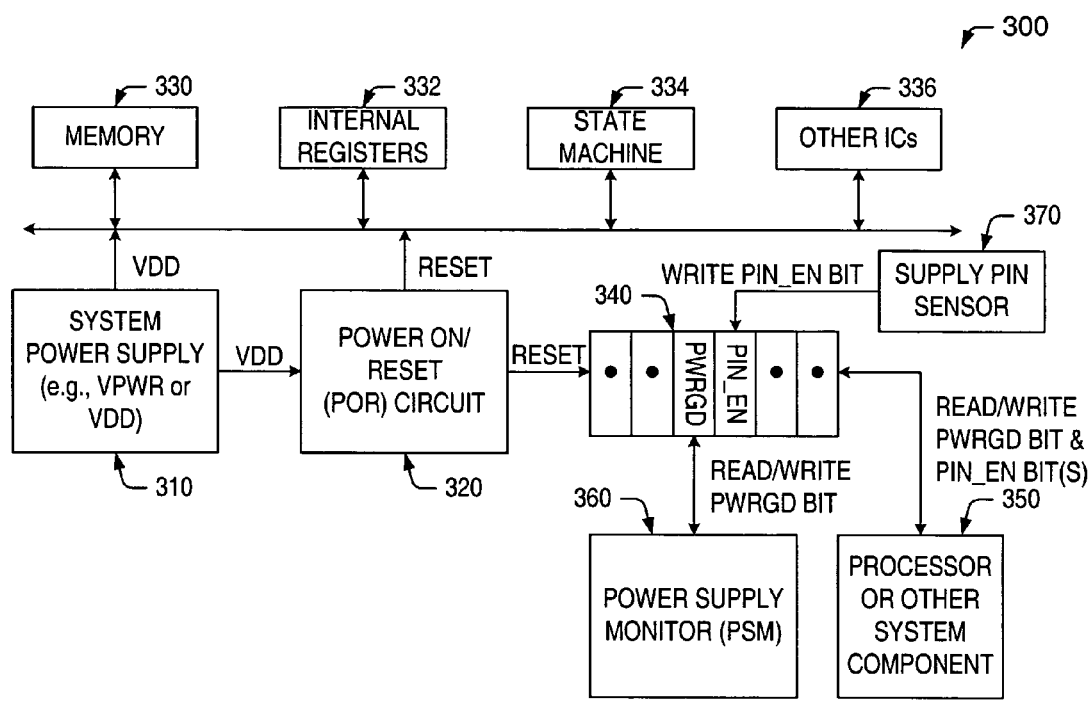
FIG. 3 is a block diagram of an exemplary system including a system power supply, a POR circuit, a status register, and exemplary circuits and methods for monitoring the integrity of the system power supply by detecting a state of one or more bits stored within the status register.

FIG. 3 is a block diagram of an exemplary system 300 including a system power supply 310, a conventional POR circuit 320, and various circuits and methods for monitoring the integrity of the power supply voltage (VDD) supplied to one or more system components 330, 332, 334, 336. As set forth below, the circuits and methods described herein may be configured for monitoring the integrity of the power supply by detecting a state of one or more bits stored within a status register 340 of the system. The stored bits may be later read, via a system processor or other component 350, for determining a cause of the power related event.

In the embodiment of FIG. 3, system 300 may represent a portion of a computer system or a standalone chip configured for performing a particular function. For example, system 300 may represent a portion of any chip having an on-chip register, which can be read via a serial or a parallel bus. In one embodiment, system 300 may be included within a clock generation chip, which may in turn be incorporated within a computer system. In some cases, system power supply 310 may comprise one or more supply pins for receiving a power supply voltage (VPWR, VDD), and in some cases, a ground supply voltage (VSS) from an external source. In other cases, however, system power supply 310 may include a voltage generator for transforming the received power supply voltage (VPWR) into one or more voltage levels (VDD) used by internal chip or system components. In any case, the received or generated voltage level(s) may be supplied to various system components for operating those components. For example, the received or generated voltage level(s) may be supplied to a volatile or non-volatile memory array 330, one or more internal registers 332, a configuration state machine 334 and/or other integrated circuits (IC's) located within the chip or system.

As noted above, power-on reset (POR) circuit 320 may be coupled to system power supply 310 for monitoring the voltage level supplied to system components 330, 332, 334, 336. As known in the art, POR circuit 320 may supply a RESET signal to the system components during normal power-up and power-down operations, as well as abnormal power related situations caused, e.g., by glitches in the power supply or even a temporary loss of power. It is noted that POR circuit 320 may be implemented by any means known in the art (including those shown in FIGS. 1A and 2A), since the generation of a RESET signal is well known and not intended as a novelty of the present invention. In fact, an advantage of the present invention is the ability to use the circuits and methods described herein with substantially any POR circuit known in the art, enabling the described circuits and methods to be easily incorporated within existing chip or system designs.

Unlike conventional designs, the RESET signal generated by POR circuit 320 is supplied to status register 340 for clearing a "power good" (PWRGD) bit stored therein. The RESET signal is de-asserted once system power supply 310 becomes stable. At this point, the PWRGD bit may be asserted (e.g., set to logic HIGH) to indicate that the power supply voltage level has reached an acceptable operating voltage level. The PWRGD bit may be set automatically by logic components (included, e.g., within PSM 360), or manually by a user of the system, once the power supply voltage becomes stable. After the PWRGD bit achieves a "set state," the bit may be monitored for any changes. As described in more detail below, a change in the PWRGD bit from a "set state" to a "cleared state" may indicate to the circuit designer or user that a power abnormality (e.g., a glitch or temporary loss of power) has occurred.

In some embodiments, the state of the PWRGD bit may be monitored by Power Supply Monitor (PSM) logic 360 located within the chip or system. Such monitoring may be performed at random, periodic and continuous intervals, as defined by the PSM logic. In a preferred embodiment, however, the state of the PWRGD bit may be monitored by a circuit designer or user of the system via the system processor or another system component 350. Such monitoring may be performed at various intervals, as the user sees fit, or after the user is alerted to a problem with the system. In one example, the PWRGD bit may be stored within an I2C register 340 located on the periphery of the chip. As such, the state of the PWRGD bit may be accessible to the user via an I2C controller and a common I2C bus. However, status register 340 should not be limited to an I2C register, and may be alternatively implemented with substantially any storage means having read/write capability. Status register 340 may also be configured to include substantially any number and/or order of status and control bits, as deemed necessary.

Regardless of configuration, the contents stored within status register 340 can be maintained by supplying power to the status register from an independent power supply. In other words, the power supplied to status register 340 may be separate and distinct from the power supply (or supplies) to be monitored by PSM logic 360. By supplying status register 340 with an independent power supply, the probability that the power supply monitoring scheme would fail due to loss of power to the storage circuitry is significantly reduced, if not eliminated.

Figure 4:
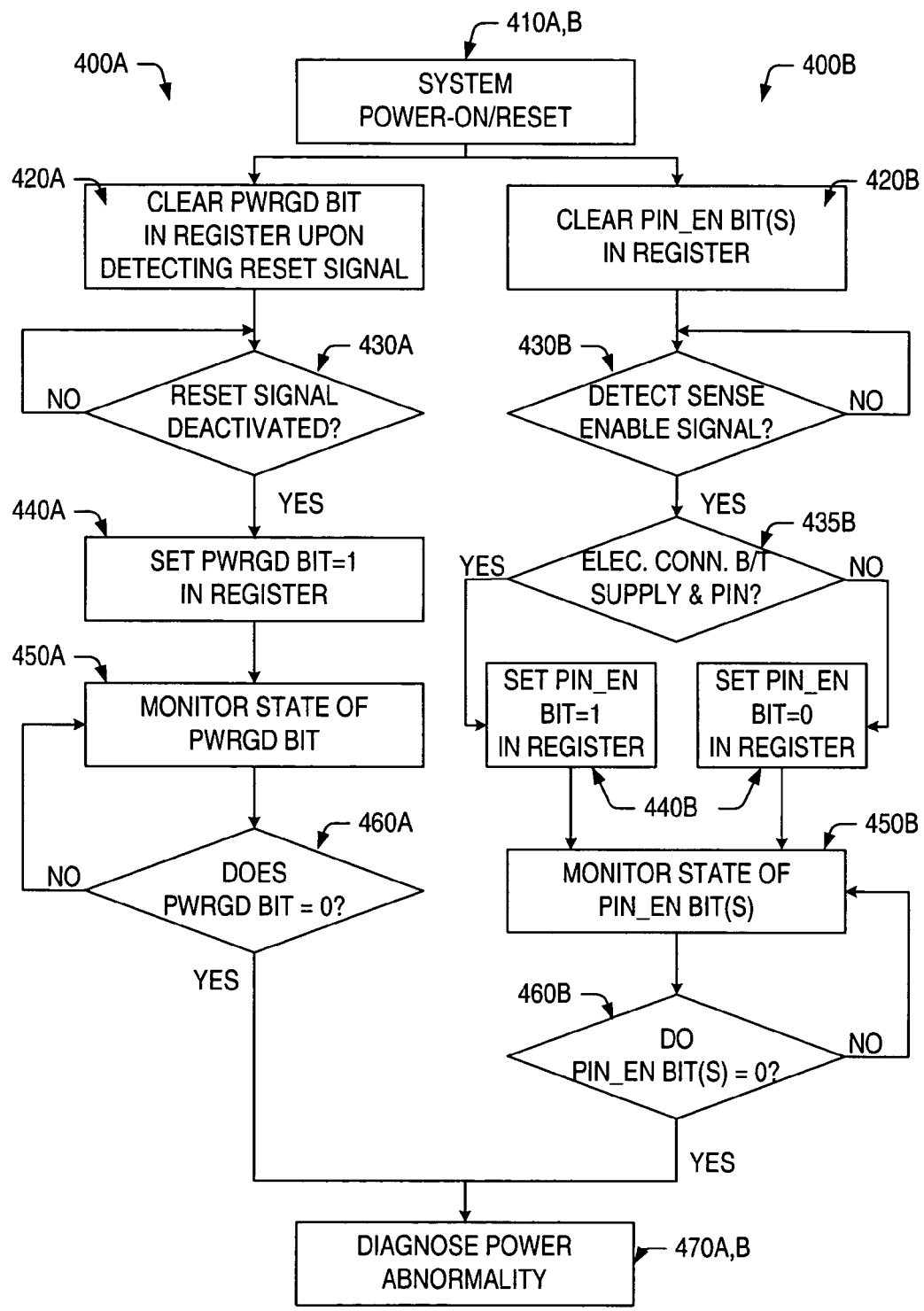
FIG. 4 is a flowchart diagram illustrating the exemplary methods for monitoring the integrity of the system power supply.

FIG. 4 illustrates exemplary methods 400 for monitoring the integrity of a power supply. More specifically, method 400 includes two distinct methods, which may be used separately or in conjunction with one another for monitoring the integrity of the power supply. The first method (denoted with subscript A) describes exemplary steps for monitoring a level of the power supply voltage. The second method (denoted with subscript B) describes exemplary steps for monitoring an electrical connection between the power supply (or ground supply) and one or more supply pins. Each of the methods involves monitoring a state of one or more bits stored in the status register 340. The first method will now be described in more detail.

An exemplary method 400A for monitoring the power supply voltage level may begin, in most cases, during the initial power-on reset sequence initialization (step 410A). During the power-on reset sequence, a RESET signal is generated (e.g., by POR circuit 320) to indicate that the power supply is ramping up in voltage. In response to the RESET signal, the PWRDG bit is cleared in the status register (step 420A) to clear the results from any previous monitoring cycles. Once the power supply voltage 310 reaches an acceptable level, POR circuit 320 may deactivate the RESET signal in step 430A. After the RESET signal is deactivated, the PWRGD bit is asserted (e.g., set to logic HIGH) in the status register 340, indicating that the power supply voltage level has reached an acceptable operating voltage level (step 440A). In some cases, the PWRGD bit may be set by logic included within PSM 360. However, in a preferred embodiment of the invention, the PWRGD bit may be set manually by a user of the system once the power supply voltage reaches the appropriate level (i.e., sometime after the RESET signal is initially detected). The state of the PWRGD bit is then monitored (step 450A)—either automatically (via logic) or manually (via user interaction)—for changes.

The step of monitoring may continue (either automatically or manually) if the PWRGD bit remains unchanged in the "set state" (step 460A). In some cases, however, POR circuit 320 may generate another RESET signal in response to a power-down reset sequence or in response to a power abnormality (such as a glitch or loss of power). If generated, the additional RESET signal may deassert the PWRGD bit (e.g., cleared to logic LOW) in the status register 340, indicating that the power supply voltage level has fallen below an unacceptable operating voltage level. If the PWRGD bit changes to a "cleared state" (step 460A), the circuit designer or user may assume that a power abnormality has occurred (such as a glitch or temporary loss of power), rather than a normal power-down reset sequence. In other words, the above method may provide the circuit designer or user with enough information to determine a cause of the power related event (step 470A), simply by monitoring the PWRGD bit for changes from a "set state" to a "cleared state."

The above-mentioned method provides numerous advantages, including but not limited to, the ability to use an existing POR circuit without necessitating significant changes to the chip or board layout, and the ability to diagnose a cause of the power failure via a bit, which may be stored within a status register and read out later. The method may be performed by internally located PSM logic at random, periodic or continuous intervals, as defined by the internal logic. Alternatively, one or more steps of the method may be performed by a circuit designer or user of the system to conserve power and area, as well as to reduce design complexity. In a preferred embodiment, the method steps described above may be performed in response to an error signal (e.g., an indication of power failure) associated with the system. The system error signal may then prompt a user of the system to activate the PSM logic, or manually perform the above-mentioned steps, so that the cause of the error may be diagnosed. In some cases, the above-mentioned method may be performed by a user of the system for substantially any reason and at substantially any time during or after system power-up.

To provide the user with additional power-related information, method 400B may be implemented separately, or along with method 400A, for monitoring an electrical connection between the system power supply (or ground supply) and one or more supply pins. In other words, another cause of power failure may be attributed to one or more supply pins (or contact pads) lifting off the board, or otherwise loosing electrical contact with the supply lines originating from the system power or ground supplies. As such, a supply pin sensor 370 (FIG. 3) and method 400B (FIG. 4) may be included for detecting power failures caused by loss of power "at the pad."

An exemplary method 400B for monitoring an electrical connection between the system power supply (or ground supply) and one or more supply pins (or contact pads) may begin, in most cases, during the initial power-on reset operation (step 410B). During the power-on reset sequence, one or more "pin enabled" (PIN_EN) bits may be cleared in the status register (step 420A) to clear any results from previous monitoring cycles. Next, the method may determine whether or not a sense enable signal is detected (step 430B). In some cases, the sense enable signal may be asserted upon system power-up so that a faulty supply pin can be identified, e.g., if the power supply level never reaches the acceptable operational level (i.e., if a RESET signal is never generated by the POR circuit). In other cases, the sense enable signal may be asserted at various intervals (e.g., randomly, periodically or continuously), or in response to an error signal associated with the system (e.g., an indication of system power failure). As such, the sense enable signal may be asserted by a user of the system, or in some cases, by additional logic (not shown) included within the system. Regardless, method 400B may be temporarily suspended until the sense enable signal is detected in step 430B.

Once the sense enable signal is detected, the one or more supply pins may be monitored via supply pin sensor 370 of FIG. 3. Various embodiments of supply pin sensor 370 are illustrated in FIGS. 5-8 and described in more detail below. Generally speaking, supply pin sensor 370 may detect whether or not an electrical connection exists between a supply potential and a respective supply pin by monitoring a voltage level supplied to a node coupled to the supply pin (step 435B). If the voltage level is greater than, e.g., a threshold voltage of a CMOS gate, a pin enabled signal may be supplied to status register 340 for setting the appropriate PIN_EN bit (steps 440B). Otherwise, a pin disabled signal may be supplied to status register 340 for clearing the appropriate PIN_EN bit (steps 440B).

If the PIN_EN bit is asserted (e.g., set to logic HIGH) in step 460B, the method may end (not shown) or continue with the step of monitoring the state of the one or more PIN_EN bits (step 450B). However, if the PIN_EN bit is deasserted (e.g., cleared to logic LOW) in step 460B, the circuit designer or user may conclude (step 470B) that the supply pin corresponding to the cleared PIN_EN bit has lifted off the board supply. In other words, the circuit designer or user may assume that an electrical connection between the board supply and the supply pin (or contact pad) has been broken.

The above-mentioned method provides numerous advantages, including but not limited to, the ability to diagnose a cause of power failure via a bit, which may be stored within a status register and read out later. Because supply pin sensor 370 is integrated "at the pad," the above-mentioned method provides additional resources for diagnosing system power failures that may occur, e.g., before the power supply voltage has had a chance to reach the acceptable operating voltage level. This may be particularly advantageous to a circuit designer during the test and debugging phases of a chip or system design. For example, consider the case in which an internal power supply bus is sourced (i.e., supplied with power) by multiple power supply pins to minimize the resistance of the internal power supply bus. If one or more of the supply pins were to lift off the board, the chip may continue to function if at least one of the supply pins is still connected to the bus. Conventional methods, which rely on precursory indications of chip failure, may fail to alert the circuit designer to a problem "at the pad." The present method enables a circuit designer or user to detect whether any of the supply pins have lifted off the board, even when the chip continues to function.

Figure 5:
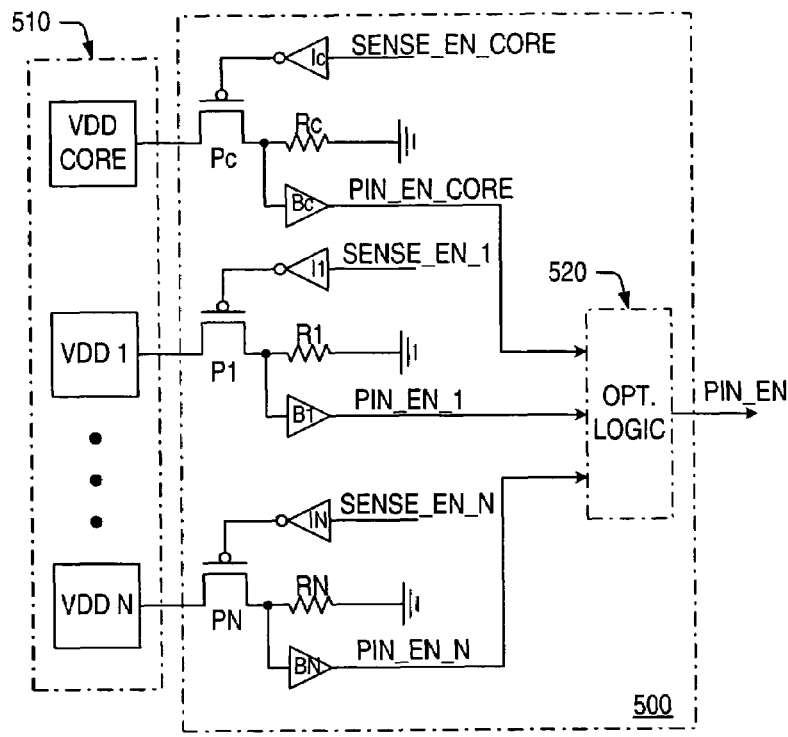
FIG. 5-6 are schematic diagrams of exemplary circuits configured for monitoring the integrity of an electrical connection between the system power supply and a power supply pin, according to various embodiment of the invention.
Figure 6:
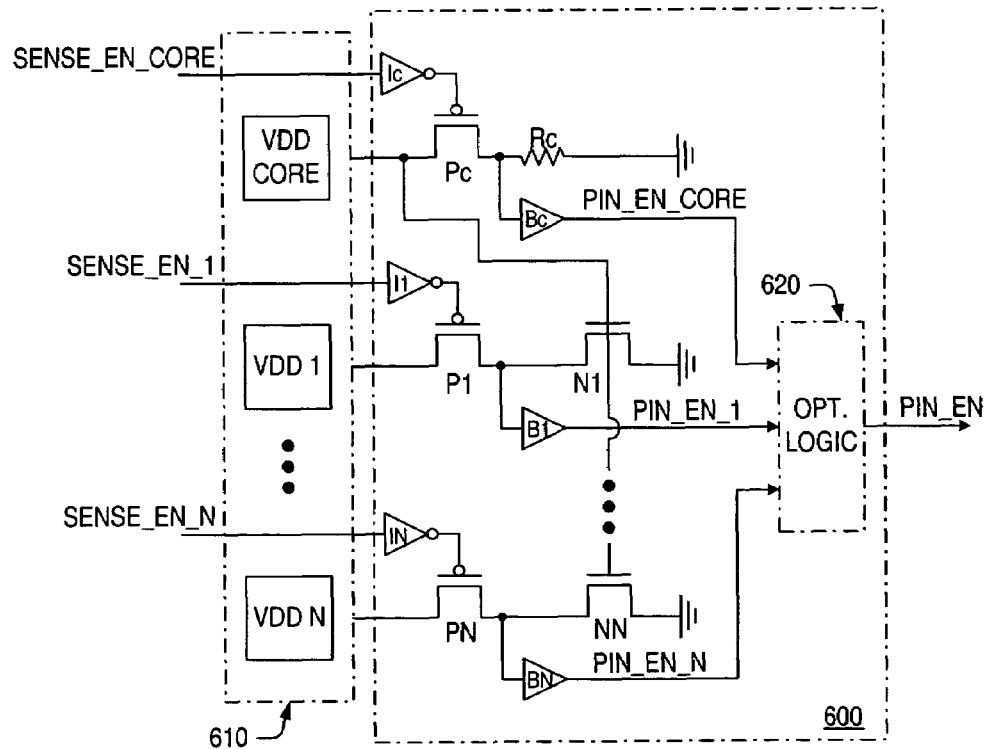
Figure 7:
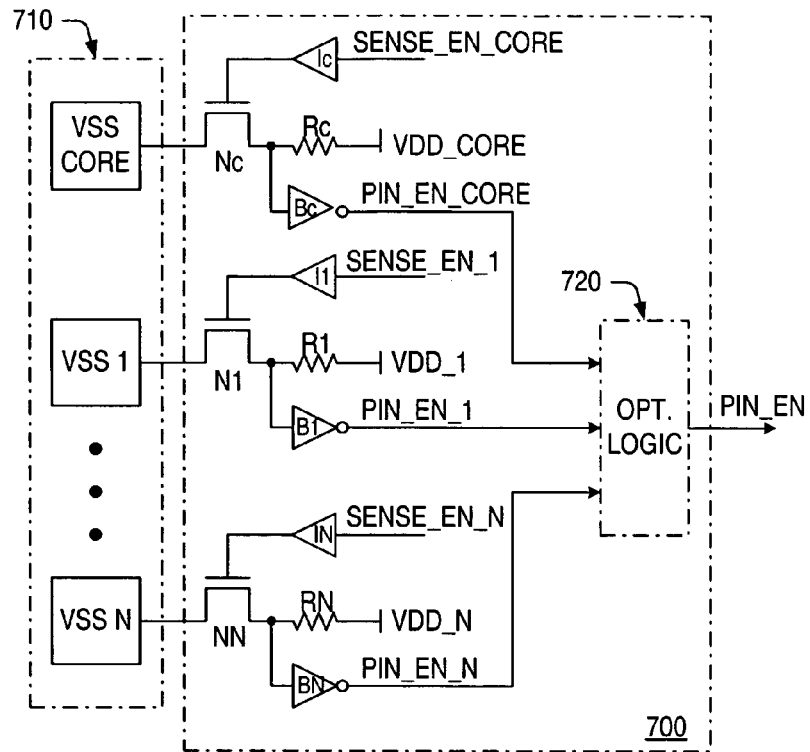
FIGS. 7-8 are schematic diagrams of exemplary circuits configured for monitoring the integrity of an electrical connection between a ground supply and a ground supply pin, according to various embodiments of the invention.
Figure 8:
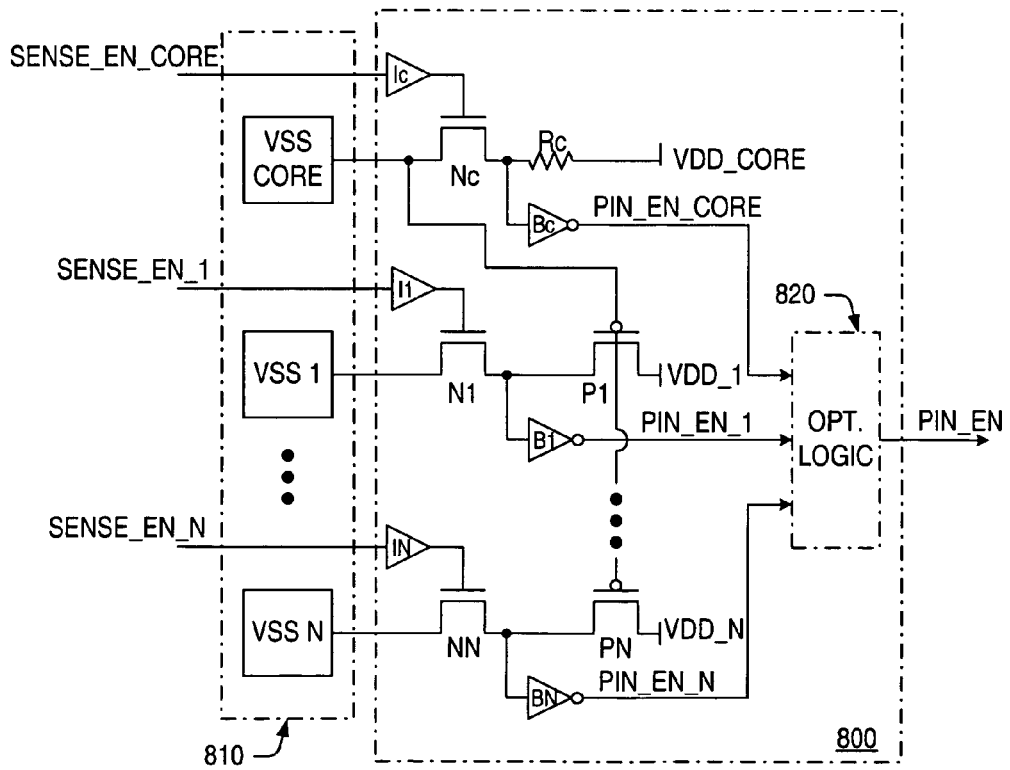

FIGS. 5-8 show exemplary circuit diagrams of supply pin sensor 370, according to various embodiments of the invention. In particular, FIGS. 5-6 illustrate circuits for monitoring the integrity of an electrical connection between a power supply (e.g., system power supply 310) and one or more power supply pins. FIGS. 7-8 illustrate alternative embodiments of the invention, including circuits for monitoring the integrity of an electrical connection between a ground supply (not shown) and one or more ground supply pins. The power and ground supply pins are generally located on the periphery or top/bottom surfaces of a chip and may be implemented in a variety of ways including, but not limited to, pins, contact pads, solder bumps, etc. As such, the term "supply pin" may be used herein to describe numerous means for connecting a power or ground supply potential to internal chip or system components.

FIG. 5 illustrates one embodiment of a supply pin sensor circuit 500 for monitoring the integrity of an electrical connection between a power supply (not shown) and one or more power supply pins 510. In some cases, circuit 500 may be configured for monitoring only one power supply pin (such as the VDD core pin), and thus, may include only a portion of the elements shown in FIG. 5. For example, circuit 500 may include a p-channel field effect transistor (transistor Pc) whose source terminal is coupled to a VDD potential through the VDD core pin, and whose drain terminal is coupled to ground (i.e., a VSS potential) through a passive load (resistor Rc). By supplying the gate terminal of transistor Pc with an active low sense enable signal (SENSE_EN_CORE), a voltage develops at the node between the drain terminal of transistor Pc and resistor Rc. If the voltage at the drain terminal node is greater than the gate threshold voltage of transistor Pc, a pin enabled signal (e.g., an asserted PIN_EN_CORE) may be supplied to status register 340 for setting the appropriate PIN_EN bit therein. If the VDD core pin is not connected to the supply potential, the drain terminal of transistor Pc is pulled down to ground by load resistor Rc. If this occurs, a pin disabled signal (e.g., a deasserted PIN_EN_CORE) may be supplied to the status register for clearing the appropriate PIN_EN bit.

If the sense enable signal is initially asserted as an active low signal, inverter Ic may be eliminated from the circuit diagram of FIG. 5. In addition, buffer Bc may not be included in all embodiments of the invention for buffering the (asserted or deasserted) pin enable signal before it is sent to the status register. In most cases, the sense enable signal may only be asserted at certain times, such as during system power up and/or when conducting a subsequent test of the power supply/pin connectivity. When the pin enabled (or disabled) signal is latched (e.g., when the test of the supply connectivity is complete), the sense enable signal may be deasserted to turn off transistor Pc and shut off the current flow to load resistor Rc. This can save power consumption within the chip.

In other cases, circuit 500 may be configured for monitoring the integrity of a plurality of supply pins (VDD core, VDD1 . . . VDDN). The number of supply pins monitored may include a portion (or a total number) of the supply pins made available to the chip. For each supply pin monitored, circuit 500 may include a p-channel transistor (transistor Pc, P1 . . . PN) coupled in series with a passive load (resistor Rc, R1 . . . RN). As noted above, a source terminal of the p-channel transistor may be coupled to a power supply potential through a respective power supply pin. The power supply potentials (VDD1 . . . VDDN) may be substantially the same as, or different from, the core power supply potential (VDD core), depending on the needs of the various components included within the chip. The drain terminal of the p-channel transistor is coupled to ground (or a VSS potential) through a passive load, while the gate terminal is coupled for receiving the sense enable signal (SENSE_EN_CORE, SENSE_EN_1 . . . SENSE_EN_N). If the voltage present at the drain terminal of the p-channel transistor is greater than the gate threshold voltage of transistor Pc, an asserted pin enabled signal (PIN_EN_CORE, PIN_EN_1 ... PIN_EN_N) is supplied to status register 340, otherwise, a deasserted signal is supplied.

In some cases, each of the asserted/deasserted pin enabled signals may be used for setting/clearing a different PIN_EN bit within status register 340. In other words, each of the plurality of pin enabled signals may be stored as a distinct bit within the status register to indicate whether or not an electrical connection exists between a power supply potential and a respective power supply pin. In other cases, the plurality of pin enabled signals may be supplied to optional logic block 520. If included, logic block 520 may generate a master pin enabled signal, which may be used for setting/clearing a single PIN_EN bit within status register 340. In some cases, the master pin enabled signal may be asserted when each of the plurality of pin enabled signals supplied thereto is asserted. In other cases, the master pin enabled signal may be asserted when at least one of the plurality of pin enabled signals is asserted. Other configurations/scenarios may be used.

Regardless, use of logic block 520 may limit the amount of information made available to the circuit designer or user by indicating whether or not an electrical connection exists between all power supply potentials and all power supply pins, or between at least one power supply potential and respective power supply pin. However, use of logic block 520 may advantageously reduce the number of status register bits required, thus, saving power, area and cost.

As in previous embodiments, the contents stored within status register 340 can be maintained by supplying power to the status register from an independent power supply. In other words, the power supplied to status register 340 may be separate and distinct from the power supply (or supplies) to be monitored by supply pin sensor circuit 500. By supplying status register 340 with an independent power supply, the probability that the supply pin sensor scheme would fail due to loss of power to the storage circuitry is significantly reduced, if not eliminated.

FIG. 6 illustrates an alternative embodiment of a supply pin sensor circuit 600 for monitoring the integrity of an electrical connection between a power supply (not shown) and one or more power supply pins 610. Since FIG. 6 includes many of the circuit elements described above in reference to FIG. 5, the description set forth below will focus on the differences between FIGS. 5 and 6. For example, most of the passive load elements (resistors R1 ... RN) included within circuit 500 are replaced with active load elements (n-channel transistors N1 ... NN) in circuit 600 to save silicon area and/or to save power (e.g., if one or more of the active loads were switched "off"). The gate terminals of transistors N1 ... NN are mutually-coupled for receiving the core power supply potential (VDD core). To ensure proper circuit operation, the VDD core pin must be electrically connected to the board supply. If the VDD core pin fails, the active load elements will be off and the sensor will not function. However, this may also provide the circuit designer with some indication that a power failure has occurred "at the pad."

FIGS. 7-8 illustrate exemplary circuits 700 and 800 for monitoring the integrity of an electrical connection between a ground supply (not shown) and one or more ground supply pins 710/810. As in the previous embodiments, the number of ground supply pins monitored may include a portion (or a total number) of the ground supply pins made available to the chip. For each ground supply pin monitored, circuits 700 and 800 may include an n-channel transistor (transistor Nc, N1 ... NN). In some cases, the n-channel transistor may be coupled in series with a passive load (resistor Rc, R1 ... RN), as shown in FIG. 7, or a combination of passive and active loads (resistor Rc, transistors P1 ... PN), as shown in FIG. 8. As noted above, active loads may be used to save silicon area, and in some cases, to save power.

The n-channel transistors of FIGS. 7-8 are each coupled between a ground supply pin (VSS core, VSS1 ... VSSN) and a power supply potential (VDD core, VDD1 ... VDDN). In particular, a drain terminal of each n-channel transistor may be coupled to a ground supply potential through a respective ground supply pin. The source terminal of each n-channel transistor may be coupled to a power supply potential through a passive or active load, while the gate terminal is coupled for receiving an active high sense enable signal (SENSE_EN_CORE, SENSE_EN_1 ... SENSE_EN_N). If the voltage present at the source terminal of the n-channel transistor is greater than a threshold voltage of inverter Bc, an asserted pin enabled signal (PIN_EN_CORE, PIN_EN_1 ... PIN_EN_N) is supplied to status register 340, otherwise, a deasserted signal is supplied.

It will be appreciated by those skilled in the art having the benefit of this disclosure that this invention is believed to provide improved circuits and methods for monitoring the integrity of a power or ground supply. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for monitoring the integrity of a power supply coupled to a system, the method comprising:

setting a first bit in a status register if a level of the power supply reaches a threshold level;

setting a second bit in the status register if a power supply pin is in electrical contact with the power supply;

monitoring the integrity of the power supply by monitoring a state of the first and second bits for changes;

determining that a power abnormality has occurred, if the step of monitoring indicates that the state of at least one of the first and second bits has changed from a set state to a cleared state; and wherein the steps of monitoring and determining are performed by a user of the system for diagnostic purposes.

2. The method as recited in claim 1, wherein prior to the step of setting the first bit, the method further comprises:

generating an output signal with a power-on/reset (POR) circuit associated with the system; and clearing the first bit in the status register if the output signal comprises a first asserted power-on/reset signal indicating an initial power-on/reset of the system.

3. The method as recited in claim 2, wherein the step of setting the first bit is performed by the user only if the output signal generated by the POR circuit comprises the first asserted power-on/reset signal followed by a deasserted power-on/reset signal.

4. The method as recited in claim 2 wherein after the step of setting the first bit, the method comprises re-clearing the first bit in the status register if a subsequent output signal generated by the POR circuit comprises a second asserted power-on/reset signal.

5. The method as recited in claim 4, wherein the steps of clearing and re-clearing the first bit are performed by supplying the first and second asserted power-on/reset signals to the status register, respectively.

6. The method as recited in claim 1 wherein if the state of the first bit changes from the set state to the cleared state, the user will determine, in the step of determining, that the level of power supply has dropped below the threshold level.

7. The method as recited in claim 2, wherein prior to the step of setting the second bit, the method further comprises:
clearing the second bit in the status register if the output signal comprises the first power-on/reset signal indicating the initial power-on/reset of the system; and
monitoring an input signal supplied to a supply pin sensor circuit associated with the system.

8. The method as recited in claim 7, wherein the step of setting the second bit is performed only if:
the input signal comprises an asserted sense enable signal; and
an output signal from the supply pin sensor circuit indicates that the power supply pin is in electrical contact with the power supply.

9. The method as recited in claim 8, wherein the method further comprises re-clearing the second bit if the output signal from the supply pin sensor circuit indicates that the power supply pin is not in electrical contact with the power supply.

10. The method as recited in claim 1, wherein:
if the state of the second bit changes from the set bit to the cleared bit, or if the second bit was never set, the user will determine, in the step of determining, that an electrical connection between the power supply pin and the power supply is broken.

11. The method as recited in claim 9, wherein the second bit is both set and cleared by supplying the output signal from the supply pin sensor circuit to the status register.

12. A circuit for monitoring the integrity of an electrical connection between a first supply potential and a first supply pin, the circuit comprising:
a transistor having a first terminal coupled to the first supply pin, a second terminal coupled to a second supply potential, and a third terminal coupled for receiving a sense enable signal; and
a status register coupled for receiving a pin enabled signal generated from the second terminal of the transistor when:
the sense enable signal is asserted; and
an electrical connection exists between the first supply potential and the first supply pin.

13. The circuit as recited in claim 12, wherein the status register is coupled for receiving a pin disabled signal generated from the second terminal of the transistor when:
the sense enable signal is asserted; and
the electrical connection between the first supply potential and the first supply pin is broken.

14. The circuit as recited in claim 13, wherein the transistor comprises a p-channel device, the first supply potential comprises a VDD potential, and the second supply potential comprises a VSS potential.

15. The circuit as recited in claim 13, wherein the transistor comprises an n-channel device, the first supply potential comprises a VSS potential, and the second supply potential comprises a VDD potential.

16. The circuit as recited in claim 13, wherein the pin enabled signal is used for setting a pin enabled bit in the status register, and wherein the pin disabled signal is used for clearing the pin enabled bit in the status register.

17. The circuit as recited in claim 16, wherein the integrity of the electrical connection between the first supply potential and the first supply pin is monitored by reading a current state of the pin enabled bit in the status register.

18. The circuit as recited in claim 13, further comprising:
a plurality of supply pins similar to the first supply pin, wherein each of the plurality of supply pins is associated with a different one of a plurality of supply potentials, which are supplied to the circuit along with the first supply potential;
a plurality of transistors, similar to the transistor, wherein each of the plurality of transistors is coupled in series between a different one of the plurality of supply pins and a respective load element, and wherein the plurality of transistors are coupled to the status register for supplying a plurality of signals thereto.

19. The circuit as recited in claim 18, wherein each of the respective load elements comprise a passive load element.

20. The circuit as recited in claim 18, wherein a respective load element associated with one of the plurality of supply pins comprises a passive load element, while a remainder of the respective load elements comprise active load elements.

21. The circuit as recited in claim 18, wherein the status register is further coupled for receiving the plurality of signals generated by the plurality of transistors when an input signal supplied to a gate terminal of each of the transistors comprises an asserted sense enable signal, and wherein each of the plurality of signals are stored as a bit within the status register to indicate whether or not an electrical connection exists between one of the supply potentials and a respective one of the supply pins.

22. The circuit as recited in claim 21, wherein the status register is further coupled for receiving an independent power supply potential for maintaining stored contents within the status register, and wherein the independent power supply potential is separate and distinct from the plurality of supply potentials.

23. The circuit as recited in claim 18, further comprising a logic block coupled for receiving the plurality of signals generated by the plurality of transistors.

24. The circuit as recited in claim 23, wherein the logic block is configured for supplying a master pin enabled signal to the status register when each of the plurality of signals generated by the plurality of transistors is asserted, and wherein the master pin enabled signal is used for setting the pin enabled bit in the status register.

25. The circuit as recited in claim 23, wherein the logic block is configured for supplying a master pin disabled signal to the status register when at least one of the plurality of signals generated by the plurality of transistors is deasserted, and wherein the master pin disabled signal is used for clearing the pin enabled bit in the status register.

* * * * *